United States Patent [19]

Whelan

[11] Patent Number: 4,554,150
[45] Date of Patent: Nov. 19, 1985

[54] DETECTOR GRADE MERCURIC IODIDE

[75] Inventor: James M. Whelan, La Canada, Calif.

[73] Assignee: University of Southern California, Los Angeles, Calif.

[21] Appl. No.: 542,250

[22] Filed: Oct. 14, 1983

[51] Int. Cl.⁴ ............................................. C01B 9/00
[52] U.S. Cl. .................................. 423/491; 156/610; 156/DIG. 82; 423/107
[58] Field of Search ................ 423/491, 107; 156/610, 156/DIG. 82

[56] References Cited

U.S. PATENT DOCUMENTS 3,480,385 11/1969 Shafer ................................. 423/491
3,649,552 3/1972 Robinson et al. .................... 423/491
4,091,084 5/1978 Schieber ............................. 423/491
4,282,057 8/1981 Faile .................................... 423/491

FOREIGN PATENT DOCUMENTS 40-2895 2/1965 Japan .................................. 156/610

OTHER PUBLICATIONS

Beinglass et al., "J. of Crystal Growth", vol. 42, (1977), pp. 166–170.
Schieber et al., Reprint from J. of Crystal Growth, (1974), pp. 205–211.
S. B. Hyder, "Trapping Effects in Silver–Doped Mercuric Iodide Crystals", Journal of Applied Physics, vol. 48, No. 1, Jan. 1977, (pp. 313–319).
Timothy W. James, Frederick Milstein, "Plastic Deformation and Dislocation Structure of Single Crystal Mercuric Iodide," Journal of Materials Science, 18, (1983), (pp. 3249–3258).
Heinz Scholz, "On Crystallization by Temperature—Gradient Reversal", Acta Electronica, 17, (pp. 69–73), 1974.
R. Minder, G. Majni, C. Canali, G. Ottaviani, R. Stuck, J. P. Ponpon, C. Schwab and P. Siffert: "Measurement of the Drift Velocity of Charge Carriers in Mercuric Iodide", J. Applied Physics, vol. 45, No. 11, Nov. 1974, (pp. 5074–5076).

Primary Examiner—T. Tung
Attorney, Agent, or Firm—Nilsson, Robbins, Dalgarn, Berliner, Carson & Wurst

[57] ABSTRACT

Chemically pure mercuric iodide is purified to form detector-grade mercuric iodide and mercuric iodide semi-conductor crystals by vaporization in an inert gas stream containing deliberate addition of oxygen and iodine vapor and crystallizing the vaporized mercuric iodide in order to remove undesired metallic iodides and organic residues, followed by the elimination of undesired oxides of mercury by the revaporization in a second inert gas stream in the presence of reducing vapors such as carbon monoxide, hydrogen iodide or iodine and recrystallization to produce detector-grade mercuric iodide, and crystal growth in such a reducing atmosphere produces semi-conductor crystals.

13 Claims, 2 Drawing Figures

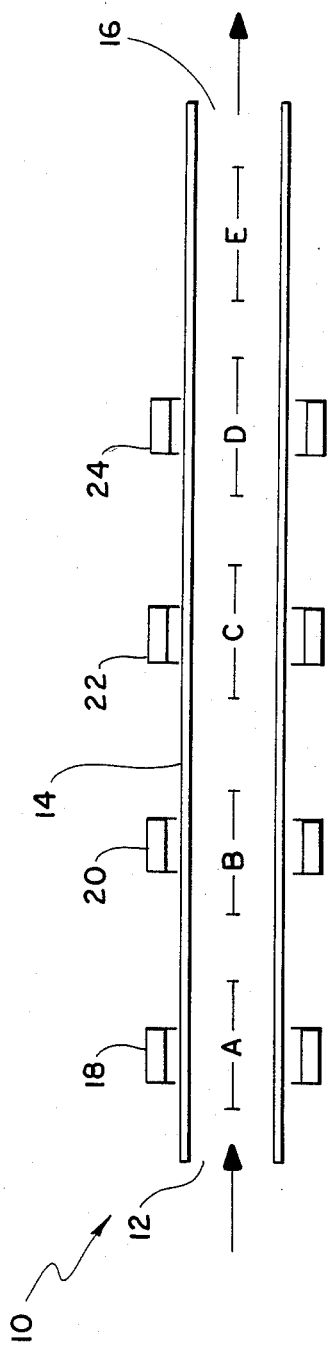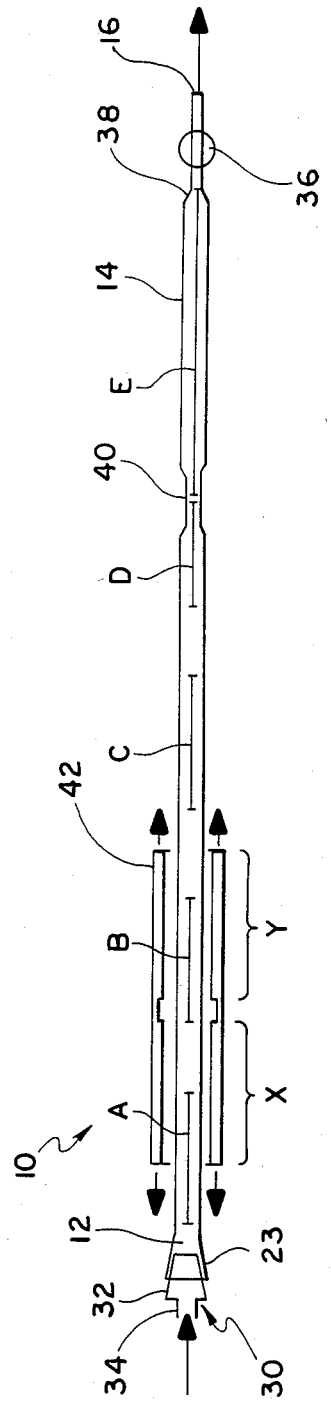

DETECTOR GRADE MERCURIC IODIDE

FIELD OF THE INVENTION

This invention pertains to the field of chemistry, and, more particularly, to the purification and growth of semi-conductor crystals.

BACKGROUND AND SUMMARY OF THE INVENTION

Numerous solid-state materials have heretofore been employed as detectors for ionizing radiation. Such semiconductor detectors have included cryogenically cooled silicon and germanium crystals which are particularly useful as energy-dispersive x-ray detectors in spectrochemical analysis.

The commonly accepted energy-dispersive x-ray detector is presently lithium-drifted silicon, and spectrometers employing this detector have the ability to simultaneously detect x-rays from most of the elements in the periodic table. However, the need to keep such detectors cooled with liquid nitrogen has posed substantial impediments to the use of energy-dispersive x-ray fluorescence systems in many applications. Thus, it has been a desideratum to develop a detector for extreme short wavelength radiation which combines the advantages of room-temperature operation, such as found in scintillation and proportional counters, with the excellent spectral energy resolution of cryogenically cooled spectrometers.

Various materials have been considered for the detection of radiation at room temperature. In the field of x-ray detection, good results have been obtained with semiconductors formed from gallium arsenide and cadmium telluride. However, these crystals present problems with regard to their transport properties and band gap sizes and thus do not provide detection with a sufficiently low dark current which is detector noise. Other solid-state compound crystals lack either good enough charge carrier transport or a large enough band gap or both. Mercuric iodide crystals have been shown to combine the advantages of good electron transport properties with a large enough energy band gap so that detectors with very low leakage current at room temperatures may be formed. Unfortunately, the yield and reproducibility in preparing satisfactory crystals is low and under inadequate control.

Relatively pure mercuric iodide undergoes a reversible phase transformation at 130° C. from a tetragonal structure to an orthorhombic structure. Crystals in the room temperature tetragonal phase are red, whereas the high temperature phase is characterized by yellow crystals. The tetragonal crystals provide the desired semiconducting effect. Since the melting point of mercuric iodide is about 250° C., the phase transformation prevents the growing of the desired tetragonal crystals by solidification of its liquid. Although it is possible to grow crystals from solution, growth from a vapor phase yields crystals to date with vastly superior electrical transport properties. Various vapor-growth techniques are known in the art. J. Saura et al., *J. Cryst. Growth*, 15 (1972) 307; H. Scholtz, *Acta Electronics*, 17 (1974) 69; and S. P. Faile et al., *J. Cryst. Growth*, 50 (1980) 752.

While these methods may yield platelets of a size and shape suitable for detector fabrication, the quality of such crystals has not been reliable, i.e., usable crystals may constitute as little as one percent of the crystals formed.

While I do not wish to be bound by any particular theory, it appears that the presence of various impurities in reagent-grade mercuric iodide is responsible for the problems heretofore described. The metallic impurities commonly present in tetragonal mercuric iodide are in the concentration range of a few to approximately 1,000 parts per million (ppm). These impurities include silicon, aluminum, the transition elements and elements from groups I and II. In addition, the presence of mercuric oxide or mercuric hydroxide impurities in trace amounts is a likely source of the wide range of structural phase transition temperatures near 130° C. In addition, the sublimation and crystal growth of mercuric iodide in a closed system in which the fugacity of oxygen may be as high as $10^{-6}$ to $10^{-3}$ atmospheres leads to the formation of mercuric oxide until the oxygen is essentially consumed, to yield a mercuric iodide: mercuric oxide dilute solid solution.

Reagent grade mercuric iodide contains an assortment of trace quantities of metallic impurities, trace amounts of organic solvents and one or more of the following oxygen containing compounds: $HgO$, $Hg(OH)_2$, $Hg_2O$, $HgI(OH)$, $Hg_2(OH)_2$ and $Hg_2(OH)I$. While these impurites may be reduced by repeated sublimation of the starting material, the effectiveness of this method is highly variable. Gross deviations (in terms of the ppm concentrations of defects) cause a one degree variation in the temperature at which the structural phase transition occurs, and thus effects crystal density and other properties.

According to the present invention, methods are provided for the purification of mercuric iodide and the growth of pure tetragonal mercuric iodide single crystals.

Mercuric iodide is purified in an open-tube system by vapor transport in an inert gas with deliberate additions of oxygen or iodine, alone or in combination. Impurities are removed by vaporizing mercuric iodide in a flowing stream of essentially inert gas in the presence of an oxygen species in an amount required to form an oxidizing vapor concentration greater than the combined vapor concentrations of the metallic and organic impurities. It is preferred to include a vapor pressure of iodine in the inert gas stream in order to minimize the formation of undesired mercuric oxides and favor the conversion of any oxygen-containing mercury compounds in the sample to mercuric iodide, the iodine vapor pressure being greater than that of the oxidizing vapor concentration. Thus, impurities such as metallic iodides are reacted to form oxides which are less volatile than mercuric iodide, and impurities such as organic residues are oxidized to form more volatile products, both of which are separated from the purified mercuric iodide vapor by gradient crystallization.

In another aspect of the invention, mercuric iodide containing small amounts of mercuric and mercurous oxides and hydroxides is purified by passing the vaporized mercuric iodide through a reaction zone in an essentially inert gas stream in which the thermodynamic equilibria and kinetics favor the conversion of oxides to iodides. A reducing species is added in an amount necessary to provide a reducing vapor pressure in excess of any oxidizing vapor pressure, thus converting oxygen containing mercury compounds to mercuric iodide.

In yet another aspect of the invention, tetragonal mercuric iodide crystals which are stable at room temperature are grown by a vaporizing mercuric iodide in an atmosphere which is essentially free of oxygen species by the addition of an excess reducing vapor pressure such as by the inclusion of one or more of the group consisting of iodine, hydrogen, hydrogen iodide or carbon monoxide, in order to limit the oxidative effect of residual oxygen containing substances which may be found in the growth environment.

BRIEF DESCRIPTION OF THE DRAWING

FIG. 1 is a schematic representation of the purification system of the present invention.

FIG. 2 is an alternative representation showing the preferred system in greater detail.

DETAILED DESCRIPTION

In brief summary, a method is described for the removal of metallic iodide impurities, organic residue and oxygen containing mercuric compounds from mercuric iodide, the presence of said impurities alone or in combination presenting substantial impediments to the reliable growth of detector grade mercuric iodide crystals. Chemically pure (CP) mercuric iodide, although considered pure for purposes of most chemical reactions, contains such impurities in part per million quantities. In addition, the storage and handling of mercuric iodide may introduce additional organic residues and oxygen containing compounds. In this regard, oxygen containing mercury compounds, as used herein, includes such compounds as mercurous and mercuric oxides, hydroxides, hydroxy-oxides and hydroxy-iodides.

Open and closed tube systems for the vaporization and formation of crystals are known in the art and will not be described in detail as they do not constitute a part of this invention. However, a schematic representation of a typical research size open-tube system 10 for the vaporization and transport of material in a flowing gas stream is shown in FIG. 1, wherein the gas flow is seen to progress from an inlet 12 through a tube 14 to an outlet 16. In this embodiment, the system 10 is seen to include heating elements 18, 20, 22 and 24 disposed about zones indicated by the reference characters A, B, C and D of the tube 14. While FIG. 1 depicts individual heating elements, it should be understood that a single movable heating element with one or two temperature zones may be employed to provide the varied temperatures as hereinafter described, and moved sequentially along the tube 14 to the desired location. Various throughputs of $H_gI_2$ can be employed with the primary features being the vapor ratios of reactants.

An inert gas, i.e., a gas which is essentially unreactive with the described elements and compounds, is introduced into the tube 14 at the inlet 12. Preferably, the inert gas stream may comprise nitrogen, helium or argon. The inert gas is maintained at atmospheric pressure and preferably flows at a rate of about 200 cm³/min.

Mercuric iodide vapor may be caused to flow through the tube 14 by any means known in the art. However, in FIG. 1 chemically pure mercuric iodide is inserted in an appropriate container or boat which is, in turn, inserted within the tube 14 at zone A. The mercuric iodide in the boat is then vaporized at a controlled rate by raising the temperature of zone A of the tube 14, by means of the heating element 18, to the temperature required to sublime the mercuric iodide, i.e., 120° C. to 250° C. Preferably, the temperature of zone A is limited to about 150° C. in order to sublime the mercuric iodide yet avoid the vaporization of the any less volatile impurities therein. The $HgI_2$ vapor concentration upon sublimation is maintained at about 90 ppm by controlling the rate of sublimation, e.g., by varying the temperature of zone A or by movement of the heating element as hereafter described.

According to the present invention, oxygen or an oxidizing compound is admixed with the mercuric iodide vapor in order to oxidize organic residues to non-condensable compounds, i.e., carbon dioxide and water, and undesired metallic iodide impurities to oxides. To facilitate these reactions, the vapor pressure of the oxygen at this stage of the process, i.e., the oxidation stage, should be maintained in excess of the vapor pressure of the impurities. As an example, the $O_2$ to $HgI_2$ vapor concentration ratio of 1 to 20 is satisfactory, although for sufficiently pure $HgI_2$, the ratio could be substantially reduced to 1 to 100 or possibly 1 to 1,000. In this regard, when oxygen is added to the inlet 12, account must be taken of the rate of the vaporization of mercuric iodide in zone A in order to maintain a constant excess of oxidizing vapor. This oxygen excess is preferentially limited to no more than 100 times that required to equal the vapor pressure of the impurities in order to avoid excessive conversion of the mercuric iodide vapor to mercuric oxide. Oxidizing vapor may be added to the mercuric iodide vapor at zone A by the addition of oxygen to the inlet 12, or the addition of oxidizing substances such as a mercury oxide to the boat. It should be noted that in the event the quantity of mercuric and mercurous oxides in the starting material is sufficiently high, the required oxidizing vapor pressure will be provided thereby.

While it is preferable to maintain a minimum sublimation temperature at zone A of the tube 14 to minimize the vaporization of less volatile components, the kinetics of the desired oxidation reaction are improved at higher temperatures. Accordingly, the vapor formed at zone A proceeds downstream to zone B where the temperature of the reacting vapor may be substantially increased as desired. In this regard, a temperature of from about 350° C. to about 600° C. may be employed, although temperatures of less than 500° C. are preferred as excessive temperatures tend to dissociate the mercuric iodide into mercurous iodide as shown by the reaction

$$2HgI_2 = 2HgI + I_2. \tag{1}$$

The minimum amount of oxygen required at zones A and B for most samples of C.P. mercuric iodide is generally from about 10 to 100 ppm, although appropriate levels may be determined empirically without undue experimentation for samples of varying purity.

It will be appreciated that the inclusion of an oxidizing vapor in zones A and B of the tube 14, while converting impurities to volatile oxides, may convert a portion of the mercuric iodide to mercuric oxide or other oxygen-containing mercury compounds as indicated by the formula

$$2HgI_2 + O_2 = 2HgO + 2I_2. \tag{2}$$

Dependent upon the desired electronic properties of the mercuric iodide, the presence of such compounds (e.g., HgO or $Hg_2O$ dissolved in the $HgI_2$) may result in undesired contamination of the crystal. Accordingly, a vapor pressure of iodine is provided in excess of the of the oxidizing vapor in order to maintain an equalibrium in reaction (2) which favors the formation of mercuric iodide and the conversion of any existing oxygen-containing mercury compounds to mercuric iodide. The optimal vapor concentration of iodine may be determined empirically or estimated from available thermodynamic data as described above with regard to the concentration of oxidizing vapor, although when employed with the preferred oxidizing vapor content of about 100 ppm, the amount of iodine vapor in the inert gas stream should at least be substantially in excess of 100 ppm. The calculation of the required amount of iodine vapor is based upon the thermodynamics of reaction (2), and may be determined in any instance according to known procedures without undue experimentation.

While the excess of iodine vapor may also affect the conversion of metallic iodides to metallic oxides, the oxide impurities of interest are more stable than the respective iodides to the extent that such a presence of iodine has virtually no effect on the desired reaction.

During the vaporization and oxidation steps hereinbefore described, the oxidized organic impurities, primarily carbon dioxide and water, are seen to exit the tube 14 via the outlet 16 along with the inert gas stream. The oxidized metallic impurities, while generally having lower volatilities than mercuric iodide, nonetheless form extremely small particles during crystallization from the vapor phase, a portion of which may be carried to the outlet 16 on the inert gas stream. The portion of the tube 14 downstream of the zone B is maintained at an appropriate temperature (i.e., room temperature or slightly thereabove) so that the remaining metallic oxide impurities condense primarily between zones B and C, at a temperature above that which would allow formation of mercuric iodide crystals, which form further downstream in zone C of the tube 14. Following the crystallization of the mercuric iodide in zone C, the addition of oxidizing material to the tube 14 may be discontinued, but the flow of the inert gas is maintained.

While the mercuric iodide crystals which have formed at zone C are substantially free of metallic oxides and organic residues, it should be understood that some oxides of mercury may unavoidably be formed during the oxidation of the metallic iodide impurities. To the extent that the presence of such oxides is likely to produce electrically active crystalline defects or otherwise disrupt the stoichiometry and function of crystals which may be formed, the mercuric iodide which has crystalized in zone C is further purified.

The heating element 22 is engaged to provide a temperature, in zone C, sufficient to vaporize the mercuric iodide therein. This temperature may range from 120° C. to 250° C., preferably about 150° C., so that only enough heat is provided to sublime the mercuric iodide in order to avoid the vaporization of any metallic oxides deposited therein or the reconversion of such oxides to iodides. As the mercuric iodide in zone C begins to vaporize, any residual oxidizing vapor in the gas stream must be minimized to once again shift the equilibrium of a formula (2) toward the formation of mercuric iodide. To further shift this equilibrium, the inert gas stream may again be enriched with iodine vapor to convert oxygen containing mercury compounds to mercuric iodide. Resublimation in an excess of iodine vapor will substantially reduce the amount of mercury oxides in mercuric iodide, and, dependent upon the amount of oxide present, repeated sublimations serve to further purify the sample.

The partial pressure of oxygen must be reduced relative to reducing vapors which favor the formation of mercuric iodide over mercuric oxide. The invention provides various alternatives for this purpose which may be employed alone or in combination. For example, hydrogen iodide vapor may be added to the inert stream so that any oxygen containing mercury vapors are converted to mercuric iodide and non-condensable water according to the formula $$HgO + 2HI = HgI_2 + H_2O. \qquad (3)$$

The excess vapor pressure of hydrogen iodide, relative to oxygen, also serves to shift the equilibrium of the reaction $$4HI + O_2 = 2H_2O + 2I_2 \qquad (4)$$

toward the formation of water vapor which similarly passes beyond the combination point, and iodine, which acts as above described.

In addition, an excess of carbon monoxide may be employed to reduce the oxygen partial pressure by the reaction $$O_2 + 2CO = 2CO_2 \qquad (5)$$

toward the formation of carbon dioxide. Alternatively, hydrogen iodide, carbon monoxide and iodine vapors may be added to the inert gas stream in any combination. When hydrogen iodide or carbon monoxide is employed, they need only be in excess of the vapor pressure of oxygen to be effective, this amount typically being about one percent of the mercuric iodide concentration in the vapor phase for most samples. If iodine vapor only is used, its thermodynamic activity should be grossly larger than the oxygen thermodynamic activity, i.e., preferably by a factor of at least 100,000. Under equilibrium conditions, the use of hydrogen iodide and iodine has been shown to reduce the oxygen activity to as little as $10^{-18}$.

Hydrogen iodide may be introduced as a gas into the inert gas stream or by vaporization from a solid phase, or formed by the addition of hydrogen gas along with iodine vapor according to the reaction $$H_2 + I_2 = 2HI \qquad (6)$$

In this regard, hydrogen should be maintained in the stream at a vapor concentration lower than that of iodine to avoid the shift of the reaction $$H_2 + HgI_2 = HI + HgI \qquad (7)$$

toward the formation of mercurous iodide.

It should be noted that the production of hydrogen iodide from hydrogen and iodine vapors according to reaction (6), in all aspects of this invention, avoids the use of reagent grade or chemically pure hydrogen iodide which is likely to be less pure than either hydrogen or iodine.

As described above with regard to zone B, temperatures in excess of that required to sublime the mercuric iodide may be desired to promote the desired reactions, and such temperatures are provided in zone D, that is temperatures similar to that described with regard to zone B. However, as heretofore described, while excessive temperatures enhance the kinetics of the conversion of mercuric oxide to mercuric iodide, such temperatures tend to effect a conversion of mercuric iodide to mercurous iodide and, in this instance, may increase the possibility of leaching oxidizing contaminants from the retaining vessel. Thus, it is preferred that the temperature in zone B be maintained at about 275° C. to 500° C. After passage through zone D, the gas stream flows through a terminal zone E which is maintained at an appropriate temperature (i.e., room temperature) to enable the crystallization of the purified mercuric iodide, with the gas stream and volatile impurities passing through the outlet 16.

Mercuric iodide crystals recovered from zone E may be used to form detector-grade single crystals according to methods known in the art. However, the invention provides a method for the growth of red-form mercuric iodide crystals (i.e., tetragonal crystalline form stable below the tetragonal-monoclinic transition temperature) from a polycrystalline source, and the control of the stoichiometry thereof. The method comprises the growth of single crystals either in a sealed, essentially evacuated ampoule or in an open-tube system with a flowing inert gas stream. In this regard, it should be noted that the methods for crystal growth now employed leach contaminating oxygen, which results in the formation of mercuric oxide, from the walls of the retaining vessels. The retaining vessel may easily be inadvertently outgassed, especially in the case of an evacuated ampoule, and evolve limited amounts of water vapor. Water vapor is also introduced almost unavoidably during the final glass or quartz seal-off. According to the invention, deliberate additions of carbon monoxide or preferably hydrogen iodide and/or iodine vapors provide a means for limiting the oxygen or water vapor that can be incorporated into the growing mercuric iodide crystals as dissolved mercuric oxide or mercuric hydroxide. The pressures of the added iodine or hydrogen iodide gases are typically small compared to the vapor pressure of mercuric iodide at its growth temperature, the latter generally being between 80° C. and 120° C. and always less than the red-yellow transition temperature. As described above, the addition of hydrogen iodide, in excess of the vapor pressure of mercuric oxide (and other mercury oxides or hydroxides) forces the equilibrium of formula (3) toward the formation of mercuric iodide, and the addition of iodine vapor forces the equilibrium of formula (2) in a similar manner.

In addition to limiting the formation of oxygen containing mercury compounds in the growth of detector grade single crystals, the stoichiometry of such crystals may be adjusted by deliberately adding small vapor concentrations of hydrogen and iodine to affect the equilibrium of reaction (7).

As previously described with regard to reaction (7), an excess of hydrogen favors the conversion of mercuric to mercurous iodide. Thus, an excess of hydrogen in the crystal growth tube tends to cause the crystals to be low in iodine due to the formation of small amounts of mercurous iodide in the crystal. On the other hand, an excess of iodine over hydrogen will cause the resultant mercuric iodide to have a stoichiometric excess of iodine such as by the interstitial inclusion of iodine within the crystal lattice of the $HgI_2$.

The following example describes in more detail the purification of mercuric oxide and the formation of detector grade crystals therefrom.

A quartz glass tube having a length of 130 cm, an outer diameter of 30 mm and a wall thickness of 1 mm, was constructed, essentially as shown in FIG. 2. In that figure, reference characters are employed which are identical with those shown in FIG. 1, where appropriate, to designate identical features. In FIG. 2, the tube 14 is seen to include a flanged end portion 28 formed at the inlet 12, the flange 23 forming a standard taper joint to matingly receive a gas inlet 30 bearing a correspondingly tapered abutting portion 32 and a collar 34 for connection to a gas supply, not shown. The outlet 16 is seen to be of a size to receive additional tubing, via a standard taper joint or other means, to conduct the gas flow from the tube 14. Upstream of the outlet 16 there is provided a stopcock 36 and a restricted portion 38 for purposes hereinafter described. The tube 14 is shown to be divided into five zones, indicated schematically by the reference characters A-E, similar to that shown by the reference numerals A-E in FIG. 1. The tube 14 is further seen to include a further restricted portion 40 located between the zones C and D.

As opposed to the four individual heating elements 18-24 shown in FIG. 1, the tube 14 in FIG. 2 is seen to be encircled by a single movable furnace 42 containing two separate and adjustable heating zones indicated by the reference characters X and Y. The furnace 42 is movable along the tube 14 to provide separate and adjacent temperatures in zones A and B, as shown, similar to those schematically represented by the heaters 18 and 20 in FIG. 1. The furnace 42 may be moved, as required, downstream so that the heating zone X overlies zone C and the heating zone Y overlies zone D in a manner similar to that performed by heating elements 22 and 24 in FIG. 1.

A Pyrex glass line, not specifically designated in FIG. 2, was connected to the collar 34 and employed to introduce appropriate gas mixtures into the inlet 12. A quartz boat containing 5 grams of chemically-pure mercuric iodide was inserted in zone A prior to making the connection of the flange 23 to the portion 32. Argon was employed as an inert gas and was purified with respect to oxygen by passage through a reverse-biased calcia-stabilized zirconia electrolytic cell. By this method, oxygen may be quantitatively added to the argon stream by forward biasing of the cell and the regulation of the electric current flow therethrough. Iodine was added to the argon stream by the passage of the inert gas over solid iodine maintained at a controlled temperature. The tube was flushed with argon gas containing 50 ppm iodine (i.e., argon saturated with iodine at 0° C. with all other materials at room temperature. The argon flow was maintained at 70 cc/min for eight hours, with the inlet oxygen thermodynamic activity between about $10^{-15}$ and $10^{-6}$.

The portion of the tube 14 in which the mercuric iodide was intended to condense after the first sublimation and reaction heating, i.e., zone C in FIG. 2, was then outgassed by heating with a gas flame to about 300° C. and raising the argon flow to 200 cc/min. During this outgas step, the nominal background oxygen remained 2 ppm or less and the iodine was maintained at 50 ppm. All other portions of the tube were maintained at room temperature.

Following the cooling of the outgassed portion, the furnace 42 was moved downstream so that zone X of the furnace was disposed about zone B of the tube 14. The temperature of zone X of the furnace was then set to 150° C. and zone Y of the furnace to 400° C., and the furnace was moved upstream at a rate of about 0.2 mm/min until zone X of the furnace was disposed around zone A. This controlled movement was calculated to control the rate of the vaporization of the mercuric iodide to maintain a vapor concentration in zone B of about 900 ppm. During this first sublimation step, the rate of argon flow was reduced to 69 cc/min and the oxygen content of the inert gas was raised to about 10 ppm. The iodine concentration remained at the saturation point (i.e., 50 ppm) as described. Since the inert argon gas was saturated with mercuric iodide in an amount of about 900 ppm, a ratio of oxygen to mercuric iodide of about 1:90 was produced.

While the flowing gas stream and the sublimation and reaction temperatures were maintained in zones A and B as described, the downstream portion of the tube remained at room temperature and mercuric iodide crystals were formed within the tube at a portion depicted by zone C in FIG. 2. A black residue was found in the boat after the sublimation of the chemically-pure mercuric iodide, due to the residue of carbon and non-volatile metallic impurities which did not vaporize at the sublimation temperature maintained in zone A.

Prior to the resublimation of the crystals formed as described the area wherein the mercuric iodide will recondense, depicted as zone E in FIG. 2, was outgassed for thirty minutes as described above. Thereafter, the gas flow was again reduced to 69 cc/min, and the oxygen input was eliminated by reverse-biasing of the electrolytic cell, while the iodine content remained at 50 ppm. In addition, hydrogen gas was added at the inlet 12 in a vapor concentration of 15 ppm. The furnace 42 was then positioned downstream so that zone X of the furnace 42 was disposed about zone D of the tube 14. The temperature of zone Y of the furnace 42 was raised to 320° C., the temperature of zone X of the furnace 42 was gradually raised to 150° C., and the furnace 42 was moved upstream at a rate of about 0.1 mm per minute until zone X of the furnace was disposed around zone C of the tube 14. This was done in a manner, as described above, which maintained the mercuric iodide content of the flowing gas at about 900 ppm. In this second sublimation step, the hydrogen and iodine react to form hydrogen iodide with an iodine excess and the mercuric oxide reacts either with the hydrogen and iodine or with hydrogen iodide to form mercuric iodide vapor and water. The estimated ratio of mercurous iodide to mercuric iodide in the mercuric iodide which condensed in zone E was less than $10^{-6}$, and based on thermodynamic calculations, the concentration of dissolved mercurous oxide in the mercuric iodide condensed in zone E was estimated to be less than 10 ppm. No residue was seen in zone C upon completion of the second sublimation, attesting to the substantial purification of the mercuric iodide by the first sublimation and reaction steps heretofore described.

Dependent upon the desired properties of the mercuric iodide in the intended purpose, the crystals from the first or second condensations (condensed in zone C or in zone E as described) may be employed for crystal growth according to methods known in the art. However, it is preferred to employ the downstream portion of the tube 14 as a crystal growth container to minimize inadvertent contamination of the purified crystals which may result from handling. While crystal growth may be performed in an open tube system, it is preferred that the crystals be grown in a closed container formed as hereinafter described.

After the second sublimation of the mercuric iodide, the crystals are condensed in zone E of the tube 14 sufficiently downstream of the restricted portion 40. After crystal formation, the gas stream containing argon, iodine and hydrogen iodide is stopped at the gas inlet 12 and the stopcock 36 is closed followed by sealing of the restricted portion 40 with a glass flame. The remainder of the downstream portion of the tube 14 is then connected to a vacuum system by connection of the outlet 16 to a high vacuum pump via glass tubing, not shown, and opening the stopcock 36 to obtain a high vacuum of about $10^{-5}$ torr or less. Zone E is then backfilled with a mixture of iodine and hydrogen iodide so that the pressure of iodine is $10^{-5}$ atm and the hydrogen iodide pressure is slightly less than $10^{-5}$ atm. This is to provide the capacity to prevent any residual oxygen resulting from desorption during the eventual seal-off of the restriction 36 which could react to form mercurous oxide dissolved in the mercuric oxide crystals. In this configuration, the sealed zone E contains mercuric iodide which has been purified to remove metallic impurities, carbonaceous material and dissolved oxygen compounds of mercury. In addition, the gas composition of the sealed zone E substantially limits the capacity for oxygen from desorption to form further impurities. A single crystal may then be grown in this sealed tube by methods which are known in the art and are not included in the invention herein described.

From the foregoing description, one skilled in the art can readily ascertain the essential characteristics of the invention and, without departing from the spirit and scope thereof, can adapt the invention to various usages and conditions. Changes in form and the substitution of equivalents are contemplated as circumstances may suggest or render expedient; and although specific terms have been employed herein, they are intended in a descriptive sense and not for purposes of limitation, the purview of the invention being delineated in the following claims.

What is claimed is:

1. A method for the purification of mercuric iodide containing metallic impurities, organic residues and oxygen containing mercury compounds, comprising vaporizing the impure mercuric iodide in an inert gas stream and oxidizing metallic impurities and organic residues by providing, in the inert gas stream, oxygen sufficient to form an oxygen partial pressure sufficient to oxidize the metallic and organic impurities and inhibiting the oxidation of mercuric iodide to mercury oxide, and converting oxygen containing mercury compounds to mercuric iodide, by adding to the gas stream an iodine vapor concentration greater than that of the oxygen, and separating the purified mercuric iodide from the impurities by gradient crystallization.

2. The method of claim 1 wherein the mercuric iodide is first vaporized in a first zone at a temperature of from about 120° C. to 250° C. and crystallized, and which further includes vaporizing the crystallized mercuric iodide in a second inert gas stream including iodine vapor, in the essential absence of oxygen, and heating the second gas stream in a second zone to a temperature of about 350° C. to 600° C. and recrystallizing the mercuric iodide after the second zone.

3. A method for the purification of mercuric iodide comprising vaporizing the mercuric iodide in an inert gas stream and converting oxygen containing mercury compounds to mercuric iodide by adding, to the inert gas stream, an excess vapor pressure of iodine, along with hydrogen iodide or carbon monoxide, or both.

4. The method of claim 3 wherein the mercuric iodide is vaporized in a first zone at a temperature of from about 120° C. to 250° C. and which further includes heating the gas stream in a second zone to a temperature of about 275° C. to 500° C. and recrystallizing the mercuric iodide after said second zone.

5. The method of claim 4 wherein the vapor contains hydrogen iodide which is produced by the addition of iodine and hydrogen to the inert gas stream, the amount of iodine being in a stoichiometric excess of the amount of hydrogen.

6. A method for the purification of mercuric iodide, comprising the steps of:

vaporizing mercuric iodide in a first inert gas stream containing oxygen and an iodine vapor pressure greater than that of the oxygen, and crystallizing the vaporized mercuric iodide from the inert gas stream;

revaporizing said crystallized mercuric iodide in a second inert gas stream containing vapor selected from iodine, hydrogen iodide and carbon monoxide, alone or in combination, and recrystallizing said revaporized mercuric iodide.

7. The method of claim 6 wherein the mercuric iodide is initially vaporized in a first zone at a temperature of from about 120° C. to 250° C. and which further includes heating the first gas stream in a second zone to a temperature of from about 350° C. to 600° C. and crystallizing the vaporized mercuric iodide after said second zone; and wherein said crystallized mercuric iodide is revaporized at a temperature of from about 120° C. to 250° C. in the second inert gas stream, and heating the second inert gas stream in a third zone to a temperature of from about 275° C. to 500° C. and recrystallizing the mercuric iodide after said third zone.

8. The method of claim 7 wherein the second inert gas stream contains hydrogen iodide vapor which is produced by the addition of iodine and hydrogen to the inert gas stream, the partial pressure of iodine being in a stoichiometric excess of that of hydrogen.

9. In a method for the growth of detector-grade mercuric iodide crystals which includes the sublimation and recrystallization of the mercuric iodide, the improvement comprising reducing the oxides of mercury in said crystals by subliming and recrystallizing the crystals in the presence of iodine vapor along with carbon monoxide or hydrogen iodide, or both.

10. The method of improvement of claim 9 wherein the crystal growth is conducted in an inert gas stream.

11. The method and improvement of claim 9 wherein the crystal growth is conducted in an evacuated zone.

12. The method and improvement of claim 9 wherein the vapor contains hydrogen iodide which is produced by the addition of iodine and hydrogen to the zone, the partial pressure of iodine being in stoichiometric excess of the hydrogen.

13. A method for the purification of mercuric iodide containing metallic impurities, organic residues and oxygen containing mercury compounds, comprising the steps of:

vaporizing mercuric iodide in a first zone at a temperature of about 120° C. to 250° C. in a first inert gas stream and oxidizing the metallic impurities and organic residues by providing, in the inert gas stream, oxygen sufficient to form an oxygen vapor pressure greater than the vapor pressure of the metallic impurities and organic residues and inhibiting the oxidation of mercuric iodide to mercury oxides by adding, to the gas stream, iodine at a partial pressure greater than that of the oxygen, heating the first gas stream in a second zone to a temperature of about 350° C. to 600° C. and crystallizing the vaporized mercuric iodide after said second zone; revaporizing said crystallized mercuric iodide at a temperature of about 120° C. to 250° C. in a second inert gas stream containing iodine vapor and hydrogen iodide or carbon monoxide, or both, heating the second inert gas stream in a third zone to a temperature of about 275° C. to 500° C. and recrystallizing the revaporized mercuric iodide after said third zone; and forming an evacuated zone around said recrystallized mercuric iodide and subliming and growing mercuric iodide crystals in the presence of iodine vapor and carbon monoxide or hydrogen iodide, or both.

* * * * *